US006169031B1

United States Patent
Lee

(10) Patent No.: US 6,169,031 B1
(45) Date of Patent: Jan. 2, 2001

(54) CHEMICAL VAPOR DEPOSITION FOR TITANIUM METAL THIN FILM

(75) Inventor: Chi-Young Lee, Chuton Hsinchu (TW)

(73) Assignee: National Science Council, Taipei (TW)

( * ) Notice: Under 35 U.S.C. 154(b), the term of this patent shall be extended for 0 days.

(21) Appl. No.: 09/321,749

(22) Filed: May 28, 1999

(51) Int. Cl.[7] .............................. H01L 21/44; B05D 5/12; C23C 16/00
(52) U.S. Cl. ........................... 438/680; 438/683; 427/99; 427/253; 427/901
(58) Field of Search ............................................ 438/680

(56) References Cited

U.S. PATENT DOCUMENTS

| | | | |
|---|---|---|---|
| 4,113,582 | * 9/1978 | Tokumoto et al. | 204/39 |
| 4,430,364 | * 2/1984 | Ito | 427/91 |
| 4,696,834 | * 9/1987 | Varaprath | 437/223 |
| 4,820,775 | * 4/1989 | Shiga et al. | 525/247 |
| 5,393,565 | * 2/1995 | Suzuki et al. | 427/255.2 |
| 5,716,870 | * 2/1998 | Foster et al. | 437/192 |
| 5,789,321 | * 8/1998 | Ohshita | 438/680 |
| 5,914,276 | * 6/1999 | Shin et al. | 438/714 |
| 5,946,594 | * 8/1999 | Iyer et al. | 438/648 |

FOREIGN PATENT DOCUMENTS

76028599 * 8/1976 (JP) .

* cited by examiner

*Primary Examiner*—Olik Chaudhuri
*Assistant Examiner*—Steven H. Rao
(74) *Attorney, Agent, or Firm*—Jacobson, Price, Holman & Stern, PLLC

(57) ABSTRACT

In-situ prepared $TiCl_2$ and $TiCl_3$ precursors to form titanium metal thin film by chemical vapor deposition at 350~800° C. Due to the low decomposition temperature of $TiCl_2$ and $TiCl_3$, titanium metal thin films were obtained at very low temperature with the by-product, $TiCl_4$, which could be reused to prepare $TiCl_2$ and $TiCl_3$.

3 Claims, 1 Drawing Sheet

CHEMICAL VAPOR DEPOSITION FOR TITANIUM METAL THIN FILM

FIELD OF THE INVENTION

This invention relates to a method for forming titanium thin films on the substrates and, more specifically to a method for forming titanium thin films on the substrates with in-situ prepared $TiCl_2$ and $TiCl_3$ precursors by chemical vapor deposition.

BACKGROUND OF THE INVENTION

Titanium (Ti) thin film is conventionally an ohmic-contact material and a metal contact material for integrated-circuit (IC) devices. Techniques of depositing titanium thin films is always important for the fabrication of IC devices. Due to the damage to common IC devices under high temperature conditions, process temperature for IC devices should be as low as possible. In average cases, 800° C. is a minimum requirement. For some temperature-sensitive devices, requirement on process temperature can be even down to 650° C.

Conventionally, titanium thin films are prepare mainly by sputtering, a branch of physical vapor deposition (PVD). Though PVD method can prepared films with higher purity at lower temperatures, it also has drawbacks such as high equipment costs, inadequacy for large-area growth, and poor step converage. On the other hand, chemical vapor deposition (CVD) is known for growing films in large area with better step converage. Therefore, it is potentially important to form titanium thin films on the substrate by chemical vapor deposition.

DESCRIPTION OF THE PRIOR ART

In 1959, Homer prepared titanium thin films by CVD with $Ti(\eta^5\text{-}C_5H_5)_2$ as the precursor. Other metalic complexes such as $Ti(\eta^7\text{-}C_7H_7)(\eta^5\text{-}C_5H_5)$, $(\eta^5\text{-}C_5H_5)$ with $R_2=CH_3, C_6H_5$ were also introduced for the growth of titanium thin films. However, carbon-contamination is unavoidable by using metalorganic titanium compounds as precursors.

Some applications also use titanium halides ($TiCl_4$, $TiBr_4$) as precursors for growing titanium thin films either by thermal or lasered chemical methods. However, process temperature as high as 1200° C. in thermal chemical reactions is too high to be applied in IC processes. Though, lasered chemical reactions proceed at lower temperature, they also rely on expensive equipments.

SUMMARY OF THE INVENTION

In accordance with the present invention, titanium halides are introduced as precursors to form titanium thin films on the substrates.

In accordance with one embodiment of the present invention, $TiCl_2$ and $TiCl_3$ are used as precursors to form titanium thin films. Due to the low decomposition temperature of $TiCl_2$ and $TiCl_3$, titanium thin films can be prepared at low process temperature.

In accordance with another embodiment of the present invention, $TiCl_2$ and $TiCl_3$ are in-situ prepared by reacting $TiCl_4$ and a titanium stripe at the front portion of the reaction chamber. Difficulty to introduce $TiCl_2$ and $TiCl_3$ is hence overcome.

Figure 1:
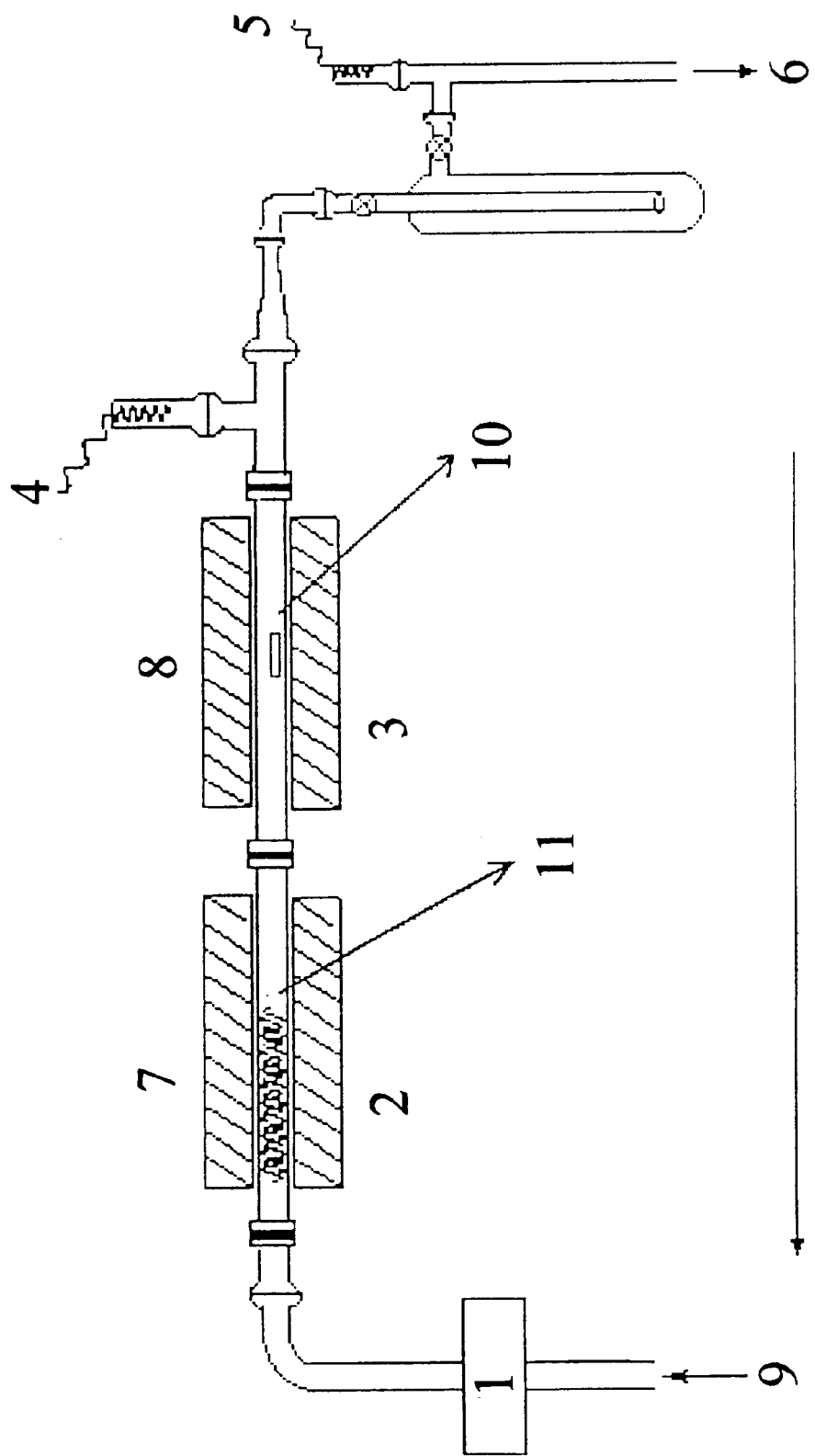
FIG. 1 is a schematic illustration of the apparatus for depositing titanium thin films with the following reference numerals identifying the elements of the invention.

1 . . . mass flow controller(MFC) 2,3 . . . heaters 6 . . . pump 4,5 . . . pressure gauges 7 . . . chamber A 8 . . . chamber B 9 . . . $TiCl_4$ 10 . . . substrate 11 . . . titanium stripe

DETAILED DESCRIPTION OF THE INVENTION

Conventionally, $TiCl_4$ and $TiBr_4$ were used as precursors for growing titanium thin films by chemical vapor deposition. Common stable titanium halides include $TiX_2$, $TiX_3$, and $TiX_4$ (X=F, Cl, Br, and I). Though $TiF_4$ and $TiI_4$ can also be thermally decomposed to form titanium, however, their high boiling points make them hard to be vaporized and therefore not easy to be introduced into the reaction chamber. Similarly, $TiX_2$ and $TiX_3$ also share the same vaporizing difficulty with $TiF_4$ and $TiI_4$ and are not considered as the precursors in chemical vapor deposition.

Although $TiCl_4$ and $TiBr_4$ are easy to be vaporized and introduced, high temperature decomposition (~1200° C.), hydrogenic reaction, or high power laser decomposition are necessary to decompose these thermally-stable titanium halogens with four covalent bonds. Such reactions, which can be formulized as:

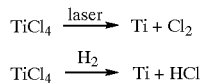

belongs to high cost and extremely dangerous regime in view of both reaction equipments and reaction gases ($H_2$, $Cl_2$, and HCl).

Reports showed that $TiCl_2$ and $TiCl_3$ can disproportion to form $TiCl_4$ and titanium at 450~700° C., where the reaction can be formulized as:

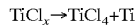

x=2,3

As mentioned earlier, $TiCl_2$ and $TiCl_3$ have high melting points and are hard to be introduced into the reaction chamber. In addition, their melting points are even higher than their decomposition temperatures and may rather be decomposed than melt at high temperature.

The present invention uses in-situ prepared $TiCl_2$ and $TiCl_3$ as precursors to form titanium thin film on a substrate. The apparatus is shown in FIG. 1. Chamber A (7) is the reaction chamber for $TiCl_2$ and $TiCl_3$, where titanium stripe (11) is placed and $TiCl_4$ (9) is directed from the bubblier. $TiCl_4$ flow rate is set by mass flow controller (1) and the temperature of heater (2) monitored by a thermalcouple is set at 900° C. Chamber B (8) is the reaction chamber for titanium thin film, where substrate (10) is seated. The reaction temperature is controlled 350 or higher and preferably at 450~700° C. to decompose $TiCl_2$ and $TiCl_3$. Titanium thin film is formed on the silicon or quartz substrates after one-hour reaction. The present invention can hence prepare titanium thin films with $TiCl_x$ (x=2, 3) at very low process temperatures. Meanwhile, the by-product, $TiCl_4$, is recyclable by pumping back to the entrance of the chamber.

A simple recyclable process which produces little contamination, shown in the present invention, is very promising for semiconductor fabrication in the future.

What is claimed is:

1. A method of forming titanium thin films, said method comprising:

producing oxidating and reducing reactions between $TiCl_4$ and a titanium stripe at a temperature as high as 900° C. to form gaseous $TiCl_2$ and $TiCl_3$, introducing the gaseous $TiCl_2$ and $TiCl_3$ into a growth chamber to form a titanium thin film on a substrate and to produce $TiCl_4$ as a by-product, and pumping the produced $TiCl_4$ away from a surface of the substrate to be used in the oxidating and reducing reactions.

2. The method according to claim 1, wherein the titanium thin film is formed at 350° C. or higher temperatures.

3. A method according to claim 2, wherein the titanium thin film is formed at 350–800° C.

* * * * *